(12) United States Patent
Bossu et al.

(10) Patent No.: US 12,453,178 B2
(45) Date of Patent: Oct. 21, 2025

(54) IC STRUCTURE FOR CONNECTED CAPACITANCES AND METHOD OF FORMING SAME

(71) Applicant: GlobalFoundries U.S. Inc., Malta, NY (US)

(72) Inventors: Germain Bossu, Dresden (DE); Nigel Chan, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 379 days.

(21) Appl. No.: 18/311,935

(22) Filed: May 4, 2023

(65) Prior Publication Data

US 2024/0371879 A1 Nov. 7, 2024

(51) Int. Cl.
*H10D 1/66* (2025.01)
*H10D 1/00* (2025.01)
*H10D 86/00* (2025.01)
*H10D 86/01* (2025.01)

(52) U.S. Cl.
CPC ........... *H10D 86/201* (2025.01); *H10D 1/047* (2025.01); *H10D 1/66* (2025.01); *H10D 86/01* (2025.01)

(58) Field of Classification Search
CPC ......... H10D 1/047; H10D 1/66; H10D 86/201
See application file for complete search history.

(56) References Cited

U.S. PATENT DOCUMENTS

| 5,059,815 | A | 10/1991 | Bill et al. |
| 5,739,576 | A | 4/1998 | Shirley et al. |
| 6,842,327 | B1 | 1/2005 | Diorio et al. |
| 10,177,163 | B1* | 1/2019 | Chan .................. H10D 30/6734 |
| 2018/0006163 | A1* | 1/2018 | Liu .......................... H10D 1/66 |

* cited by examiner

*Primary Examiner* — Wasiul Haider
(74) *Attorney, Agent, or Firm* — Francois Pagette Hoffman Warnick LLC

(57) ABSTRACT

An integrated circuit (IC) structure, including a semiconductor-on-insulator (SOI) substrate, the SOI substrate including a buried insulator layer over a base semiconductor layer, and a semiconductor-on-insulator (SOI) layer over the buried insulator layer. The IC structure further includes a gate over a gate dielectric layer over the SOI layer. The IC structure includes an n-type metal-oxide semiconductor (n-MOS) capacitor. The n-MOS capacitor includes an n-well under the buried insulator layer, and an n-type semiconductor adjacent a first side of the gate. The IC structure also includes a p-type metal-oxide semiconductor (p-MOS) capacitor adjacent the n-MOS capacitor and includes a p-well adjacent the n-well and a p-type semiconductor adjacent a second side of the gate. The gate is electrically connected only to the n-MOS capacitor and the p-MOS capacitor.

20 Claims, 8 Drawing Sheets

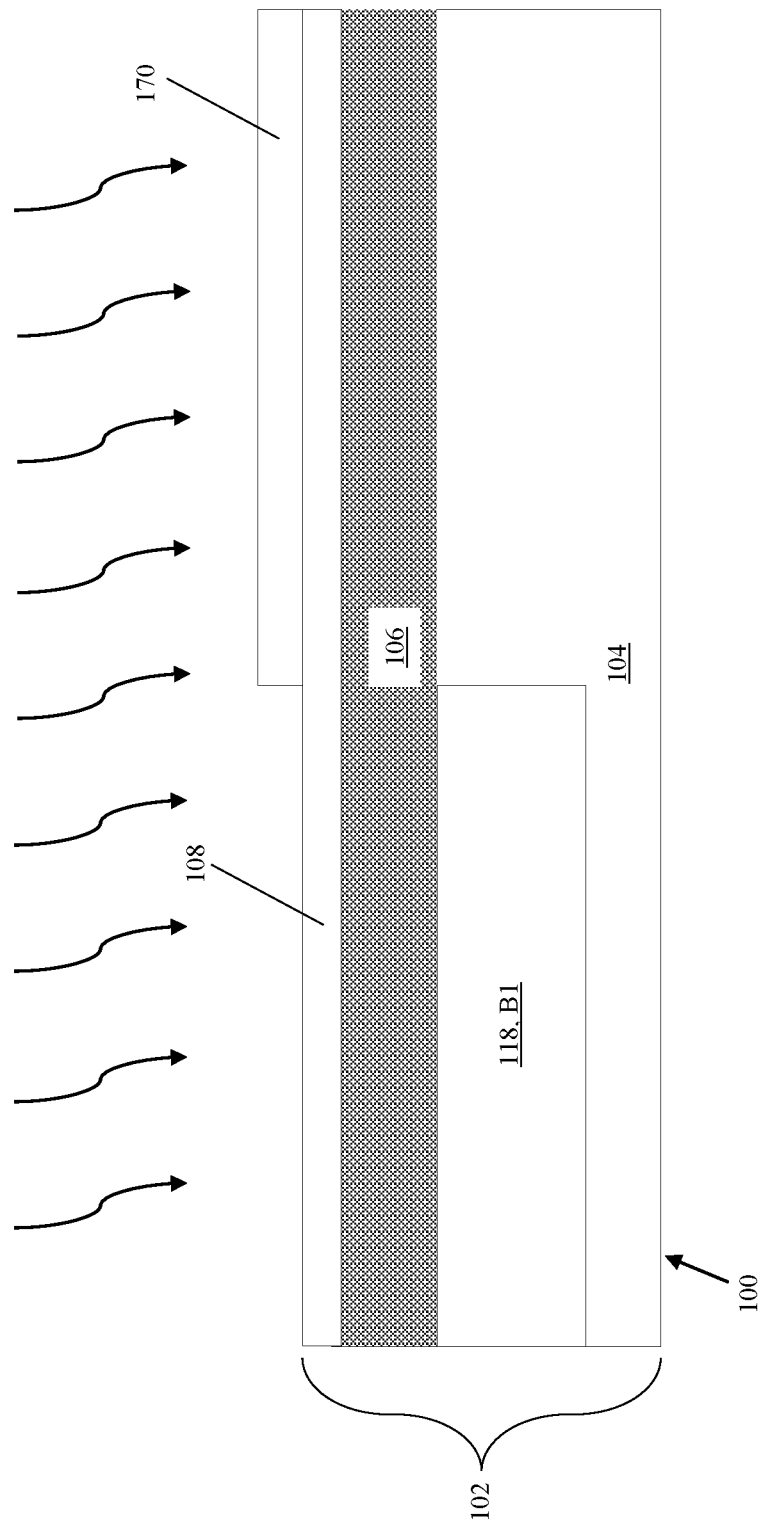

IC STRUCTURE FOR CONNECTED CAPACITANCES AND METHOD OF FORMING SAME

TECHNICAL FIELD

Embodiments of the disclosure relate generally to integrated circuit (IC) structures. More particularly, the disclosure relates to area-efficient capacitors in semiconductor-on-insulator IC structures.

BACKGROUND

Integrated circuit (IC) devices are expected to remain functional for years after fabrication. One aspect of device reliability is breakdown voltage. In a typical IC device, dielectric breakdown voltage (Vmax) refers to the voltage at which a dielectric material will act as a conductor, which is frequently fatal to the device. As device dimensions decrease, maintaining adequate dielectric thickness to avoid breakdown is a challenge because Vmax is generally proportional to dielectric thickness. While fabricating thick dielectric materials will increase a device's Vmax, this also increases device size, which is undesirable. Therefore, device design that can increase Vmax while maintaining or decreasing dielectric thicknesses with minimal or no process change is desirable because it increases device reliability and saves processing time and costs.

SUMMARY

An aspect of the disclosure includes an integrated circuit (IC) structure, comprising: a semiconductor-on-insulator (SOI) substrate, including a buried insulator layer over a base semiconductor layer, and a semiconductor-on-insulator (SOI) layer over the buried insulator layer; and a device, including: a gate over a gate dielectric layer over the SOI layer; an n-type metal-oxide semiconductor (n-MOS) capacitor, including: an n-well under the buried insulator layer, and an n-type semiconductor adjacent a first side of the gate; and a p-type metal-oxide semiconductor (p-MOS) capacitor adjacent the n-MOS capacitor and including: a p-well adjacent the n-well, and a p-type semiconductor adjacent a second side of the gate, and wherein the gate is electrically connected only to the n-MOS capacitor and the p-MOS capacitor.

Another aspect of the disclosure includes an integrated circuit (IC) structure, comprising: a semiconductor-on-insulator (SOI) substrate including a base semiconductor layer, a buried insulator layer over the base semiconductor layer, and a semiconductor-on-insulator (SOI) layer over the buried insulator layer; and a first device including: a gate over a gate dielectric layer over the SOI layer; an n-type metal-oxide semiconductor (n-MOS) capacitor, including: an n-well under the buried insulator layer, and an n-type semiconductor adjacent a first side of the gate; and a p-type metal-oxide semiconductor (p-MOS) capacitor, including: a p-well adjacent the n-well, and a p-type semiconductor adjacent a second side of the gate, and the second device adjacent the first device and including: a gate over a gate dielectric layer over the SOI layer; an n-MOS capacitor, including: an n-well under the buried insulator layer, and an n-type semiconductor adjacent a first side of the gate; and a p-MOS capacitor, including: a p-well adjacent the n-well, and a p-type semiconductor adjacent a second side of the gate, wherein the n-MOS capacitor and p-MOS capacitor of the first device and the n-MOS capacitor the p-MOS capacitor of the second device are each electrically serially connected.

Another aspect of the disclosure includes a method of forming an integrated circuit (IC) structure, comprising: forming a device over a base semiconductor layer of a semiconductor-on-insulator ("SOI") substrate, the SOI substrate including a buried insulator layer over the base semiconductor layer, and a semiconductor-on-insulator (SOI) layer over the buried insulator layer, the device including: forming a gate over a gate dielectric layer over the SOI layer, forming an n-type metal-oxide semiconductor (n-MOS) capacitor, including: forming an n-well under the buried insulator layer, and forming an n-type semiconductor adjacent a first side of the gate; and forming a p-type metal-oxide semiconductor (p-MOS) capacitor adjacent the n-MOS capacitor and including: forming a p-well adjacent the n-well, and forming a p-type semiconductor adjacent a second side of the gate, and electrically connecting the gate to only the n-MOS capacitor and to the p-MOS capacitor.

BRIEF DESCRIPTION OF THE DRAWINGS

The embodiments of this disclosure will be described in detail, with reference to the following figures, wherein like designations denote like elements, and wherein:

FIG. 4A shows an alternative cross-sectional view of forming a well at a step during fabrication, according to embodiments of the disclosure.

Figure 1:
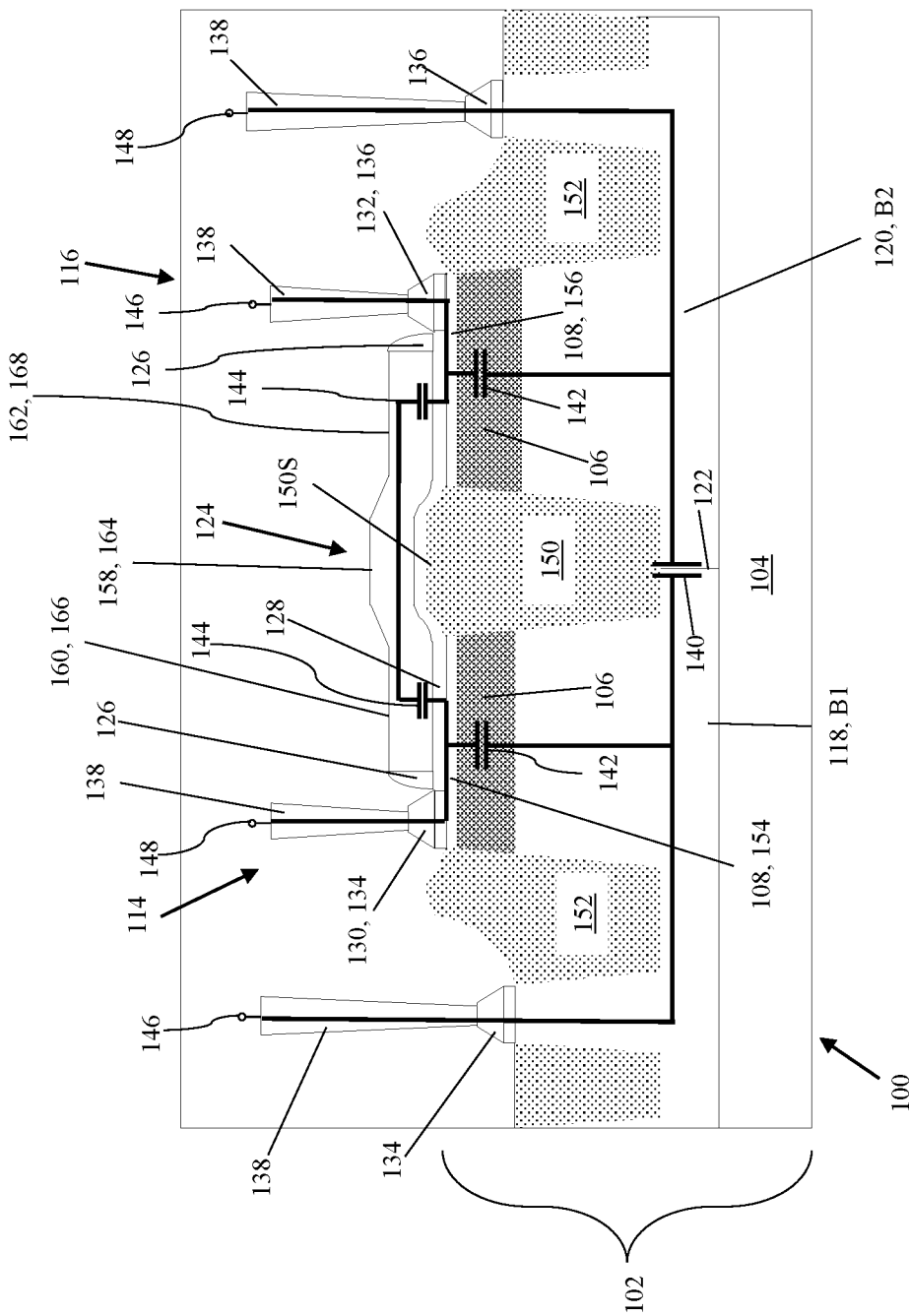
FIG. 1 shows a cross-sectional view of an integrated circuit structure with schematic capacitance indicators overlayed, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an integrated circuit (IC) structure, including a semiconductor-on-insulator (SOI) substrate, the SOI substrate including a buried insulator layer over a base semiconductor layer, and a semiconductor-on-insulator (SOI) layer over the buried insulator layer. The IC structure further includes a gate over a gate dielectric layer over the SOI layer and an n-type metal-oxide semiconductor (n-MOS) capacitor. The n-MOS capacitor includes an n-well under the buried insulator layer, and an n-type semiconductor adjacent a first side of the gate. The IC structure also includes a p-type metal-oxide semiconductor (p-MOS) capacitor adjacent the n-MOS capacitor, the p-MOS capacitor including a p-well adjacent the n-well, and a p-type semiconductor adjacent a second side of the gate. The gate is electrically connected only to the n-MOS capacitor and the p-MOS capacitor. By decreasing device capacitance without significantly increasing dielectric thickness, the devices may function at higher voltages with minimal or no process changes. That is, device performance is increased without any significant increases in costs.

FIG. 1 shows cross-sectional views of an integrated circuit (IC) structure 100 (or simply "structure") according to embodiments of the disclosure. Structure 100 may include a semiconductor substrate 102. Semiconductor substrate 102 may be any substrate available. Semiconductor substrate 102 may take the form of, for example, a semiconductor-on-insulator (SOI) substrate or a fully-depleted SOI substrate. For purposes of description, semiconductor substrate 102 is illustrated and described as an "SOI substrate" 102. An SOI substrate includes a layered semiconductor-insulator-semiconductor substrate in place of a more conventional silicon substrate (bulk substrate). SOI substrate 102 includes a semiconductor-on-insulator (SOI) layer 108 over a buried insulator layer 106 over a base semiconductor layer 104. A fully-depleted semiconductor-on-insulator, or FD-SOI, substrate, is a planar process technology that uses an ultra-thin layer of insulator, i.e., buried insulator layer 106, positioned on top of base semiconductor layer 104, and a very thin semiconductor layer, i.e., SOI layer 108, over buried insulator layer 106 that provides the transistor channel. SOI layer 108 may be ultra-thin and does not need to be doped to create the channel, thus making the transistor "fully depleted." FD-SOI provides better transistor electrostatic characteristics compared to bulk semiconductor technology. In a typical field effect transistor (FET), buried insulator layer 106 lowers the parasitic capacitance between the drain and source, and confines the electrons flowing from the source to the drain, reducing leakage currents that damage performance. SOI layer 108 and base semiconductor layer 104 may include but are not limited to: silicon, germanium, silicon germanium, silicon carbide, and those consisting essentially of one or more III-V compound semiconductors. Buried insulator layer 106 may include any appropriate dielectric such as but not limited to silicon dioxide, i.e., forming a buried oxide layer (hereafter "BOX layer 106"). The precise thickness of BOX layer 106 and SOI layer 108 may vary widely with the intended application. A portion of or the entire semiconductor substrate may be strained.

In the structures and method described herein, a semiconductor material refers to a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Structure 100 may further include a device 110. Device 110 may be a collection of other complementary metal-oxide semiconductor (CMOS) devices and/or subcomponents, including capacitors, transistors, contacts, etc. Specifically, device 110 may include an n-type metal-oxide semiconductor capacitor (n-MOS) capacitor 114 and a p-type metal-oxide semiconductor capacitor (p-MOS) capacitor 116. A capacitor is a two-terminal device (electrical or electronic component) that can store energy in the electric field between a pair of conductive electrodes. Capacitors are created within IC devices wherever a dielectric is between two conductors that are at different voltages. The two conductors are often called the "plates" of the capacitor. Generally, an oxide or other high-k dielectric material is between the capacitor plates. Examples of high-k material include but are not limited to metal oxides tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($HfA1SiA2OA3$) or hafnium silicate oxynitride ($HfA1SiA2OA3NA4$), where A1, A2, A3, and A4 represent relative proportions, each greater than or equal to zero and A1+A2+A3+A4 (1 being the total relative mole quantity). Capacitors are often fabricated similarly to transistors on chips but are modified to act as capacitors.

Capacitors may have several modes of operation depending on how the voltages are configured in a device (known as "biasing" the device). Such modes of operation include accumulation mode, depletion mode, or, as relevant to this disclosure, inversion mode. Inversion mode is when a majority of carriers in a doped material form a channel in the presence of an electric field. The process of storing energy in the capacitor is known as "charging," and involves electric charges of equal magnitude, but opposite polarity, building up on each plate. Every oxide has a breakdown voltage (Vmax), however, after which the dielectric material undesirably conducts electricity. Therefore, every capacitor that includes a dielectric has a Vmax after which it will not function as a capacitor.

Still referring to FIGS. 1, n-MOS capacitor 114 may include an n-type well (n-well) 118 under BOX layer 106, thereby defining a first body terminal B1, and p-MOS capacitor 116 may include p-well 120 adjacent n-well 118, thereby defining a second body terminal B2. Doped portions of a substrate may be known in the art as a "well." A well commonly refers to the implanted/diffused region in semiconductor wafer needed to implement a complementary metal oxide semiconductor (CMOS) cell. A "deep well" refers to doped semiconductor material located underneath active device components and/or other wells. A "shallow well," similar to a deep well, is an area of doped semiconductor material located beneath active device components but not to the same depth as a deep well. Hence, it is possible for a highly doped active semiconductor material to be located inside of a shallow well or deep well, and/or for the shallow well in turn to be located inside of a deep well. Additional levels of wells may be provided in further device structures, e.g., to produce a "triple well" stack of doped semiconductor materials and/or more complex arrangements of layers having distinct doping polarities and/or types.

In a typical metal oxide field effect transistor, applying different voltages to a gate and a body terminal results in inversion mode functionality. Applying voltage to the body terminal creates an electric field that biases the channel. Here, body terminals B1 and B2 may be biased through connecting n-well 118 and p-well 120 to voltage sources, as opposed to connecting a gate to a voltage source. A gate is a terminal in a standard IC device through which a voltage is applied to the device and is discussed in further detail below.

Here, device 110 may include a gate 124. Specifically, n-MOS capacitor 114 may include an n-type semiconductor 130 adjacent a first side of gate 124. As previously discussed, a typical gate is a device terminal which typically receives a direct application of voltage. As explained in further detail herein, gate 124 may not be connected to an electrical signal (often referred to in the art as "floating") and electrically shared between only n-MOS capacitor 114 and p-MOS capacitor 120. In some implementations, n-type semiconductor 130 may include an n-type epitaxial material 134 and p-type semiconductor 132 may include a p-type epitaxial material 136. The terms "epitaxial" and "epitaxially formed and/or grown" refers to the growth of a semiconductor material on a deposition surface of a semiconductor material, in which the semiconductor material being grown may have the same crystalline characteristics as the semiconductor material of the deposition surface. N-type semiconductor 130 and p-type semiconductor 132 may be used to bias and/or electrically connect device 110 to conductive layers thereover (not shown).

In some implementations, SOI layer 108 may include a first SOI layer portion 154 under n-type semiconductor 130 of n-MOS capacitor 114 and a second SOI layer portion 156 under p-type semiconductor 132 of p-MOS capacitor 116. In such implementations, first SOI layer portion 154 and second SOI layer portion 156 are discontinuous. N-type semiconductor 130 may be used to apply a voltage to first SOI layer portion 154 while p-type semiconductor 132 may be used to apply a voltage to second SOI layer portion 156.

As previously mentioned, device 110 may include gate 124 over gate dielectric layer 128 over SOI layer 108. Gate 124 may further be between n-MOS capacitor 114 and p-MOS capacitor 116. As discussed previously, gates in IC devices typically allow a voltage to be applied to the body terminal beneath (region beneath gate). In fully-depleted SOI devices, however, gates are not connected to an electrical signal (i.e., floating). That is, they do not have contacts thereon to apply an electric field to a depletion region beneath. Rather, the body bias comes from an electric field across body terminals B1 and B2, in this case n-well 118 and p-well 120. Gate 124 may include any now known or later developed gate material. In one non-limiting example, gate 124 may include polysilicon. In another example, gate 124 may include a metal gate.

Gate 124 may include one or more components. For example, gate may include a high dielectric constant (high-K) layer which functions as gate dielectric layer 128. Gate dielectric layer 128 may include any now known or later developed gate dielectric materials such as but not limited to hafnium silicate (HfSiO), hafnium oxide ($HfO_2$), zirconium silicate (ZrSiOx), zirconium oxide ($ZrO_2$), silicon oxide ($SiO_2$), silicon nitride ($Si_3N_4$), silicon oxynitride (SiON), high-k material or any combination of these materials. Gate 124 may further include spacers 126, which may include any now known or later developed spacer material such as silicon nitride. In some implementations, gate dielectric layer 128 may include multiple thicknesses and/or multiple materials. Spacers 126 generally function as protection barriers during fabrication and as electrical insulators during device operation.

In some implementations, gate 124 may include a first portion 158 between a second portion 160 and a third portion 162. First portion 158 may include an uppermost surface 164 above an uppermost surface 166 of second portion 160 and an uppermost surface 168 of third portion 162.

Structure 100 may include a trench isolation 150 under gate 124. Trench isolation 150 is dielectric material used to physically and/or electrically isolate device components. Trench isolation 150 may extend between an interface 122 between n-well 118 and p-well 120. In some implementations, trench isolation 150 may include a raised portion 150S under gate 124 and vertically between first SOI layer portion 154 and second SOI layer portion 156.

In an embodiment shown in FIG. 1, device 110 may include a first voltage source 146 connected to p-type semiconductor 132 and n-well 118. First voltage source 146 may output a first voltage. In that same embodiment, device 110 may include a second voltage source 148 connected to n-type semiconductor 130 of n-MOS capacitor 114 and p-well 132 of p-MOS capacitor 116. Second voltage source 148 may output a second voltage. Here, the second voltage is greater than the first voltage.

Device 110 may include several capacitors created by the architecture therein as described above. Device 110 may include junction capacitors 140 at interface 122 between n-well 118 and -p-well and 120, and BOX capacitors 142 between n-well 118 and p-well 120 and SOI layer 108 thereover. A junction capacitor is a capacitor created at an interface between two doped regions of opposite polarity, e.g., a P-N junction. A BOX capacitor is created where conductive materials on are opposite sides of BOX layer 106. As discussed further herein, there is a benefit to electrically connecting multiple devices together, because each additional device would create n additional junction capacitors 140 where n-well 118 and p-well 120 of any two devices meet at interface(s) 122 within structure 100, where n is the number of additional devices.

Moreover, n-MOS capacitor 114 and p-MOS capacitor 116 within first device 110 may each include field-effect transistor ("FET") capacitors 144. FET capacitors 144 form between SOI layer 108 and gate 124. Each FET capacitor 144 has the highest capacitance relative to junction capacitors 140 and BOX capacitors 142, but the lowest relative Vmax. Thus, FET capacitors 144 may be electrically serially connected within structure 100 to increase the Vmax of each n-MOS capacitor 114 and p-MOS capacitor 116, and therefore, the Vmax of device 110, as desired. Total capacitance of structure 100 may decrease by connecting FET capacitors 144 electrically in series. However, by connecting FET capacitors 144 in parallel with each junction capacitors 140 and BOX capacitors 142 through selective biasing of specific regions within structure 100, decrease in total capacitance of device 110 may be minimized.

By including gate 124 in the aforementioned electrical configuration, which floats at potential between a potential between n-type semiconductors 130 and p-type semiconductors 132, the Vmax before the FET capacitances 144 is increased relative to the conventional gate dielectric 128 Vmax. Additionally, electrically connecting n-well 118 to p-type semiconductor 132 creates a positive potential in n-well 118 relative to gate 124, thereby creating an n-type channel in SOI layer 108 thereunder and creating capacitance between n-type semiconductor 130 and gate 124 across the full area of gate dielectric 128. Similarly, electrically connecting p-well 120 to n-type semiconductor 130 creates a negative potential in p-well 120 relative to gate 124, thereby creating a p-type channel in SOI layer 108 thereunder and creating the capacitance between p-type semiconductor 132 and gate 124 across the full area of gate dielectric layer 128.

Figure 2:
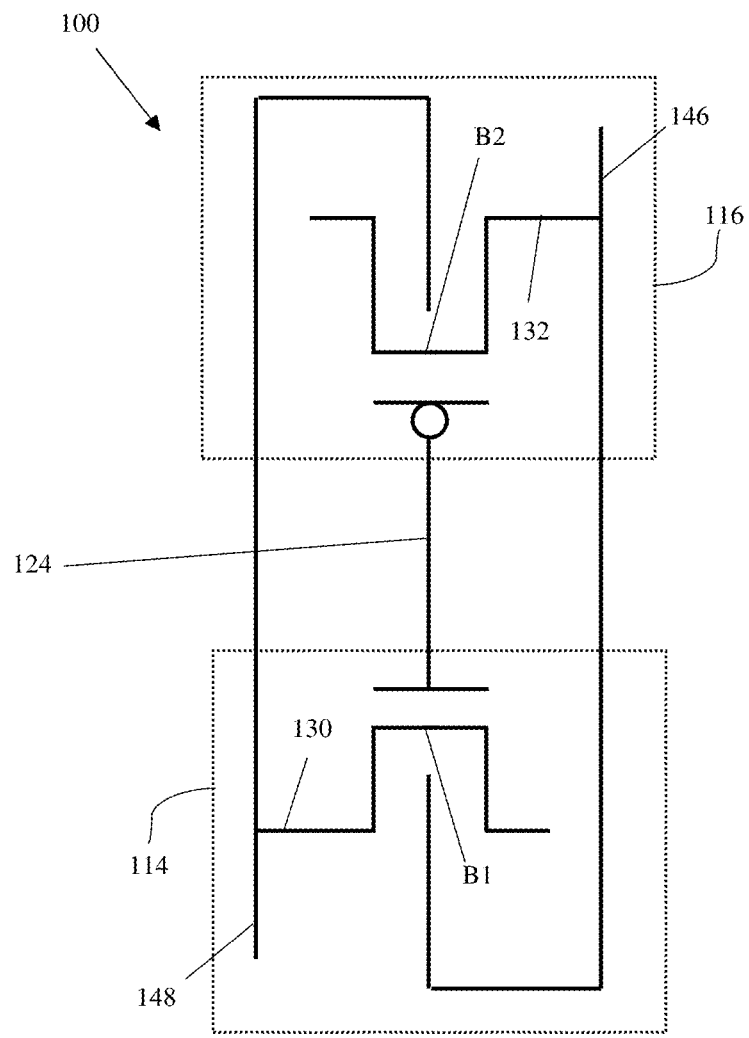
FIG. 2 shows a circuit diagram of two metal oxide capacitors, according to embodiments of the disclosure.

FIG. 2 shows a circuit diagram view of structure 100 as shown in FIG. 2. That is, FIG. 2 is a circuit diagram of n-MOS capacitor 114 and p-MOS capacitor 116 with FET capacitances 144 electrically connected in series. First voltage 146 is electrically connected to body terminal B1 of n-MOS capacitor 114 and to p-type semiconductor 132 of p-MOS capacitor 116, while second voltage 148 is electrically connected to body terminal B2 of p-MOS capacitor 116 and to n-type semiconductor 130 of n-MOS capacitor 114. Here, as in other implementations, first voltage source 146 outputs a voltage greater than a voltage outputted by second voltage 148. Gate 124 may not be connected to an electrical signal (i.e., gate 124 may be floating) and, therefore, is at a voltage between the first voltage and the second voltage. The electrical configuration illustrated in FIG. 3 electrically serially connects FET capacitances 144 (not shown in FIG. 2), thereby decreasing the capacitance, but increasing the Vmax, of n-MOS capacitor 114 and p-MOS capacitor 116.

Figure 3A:
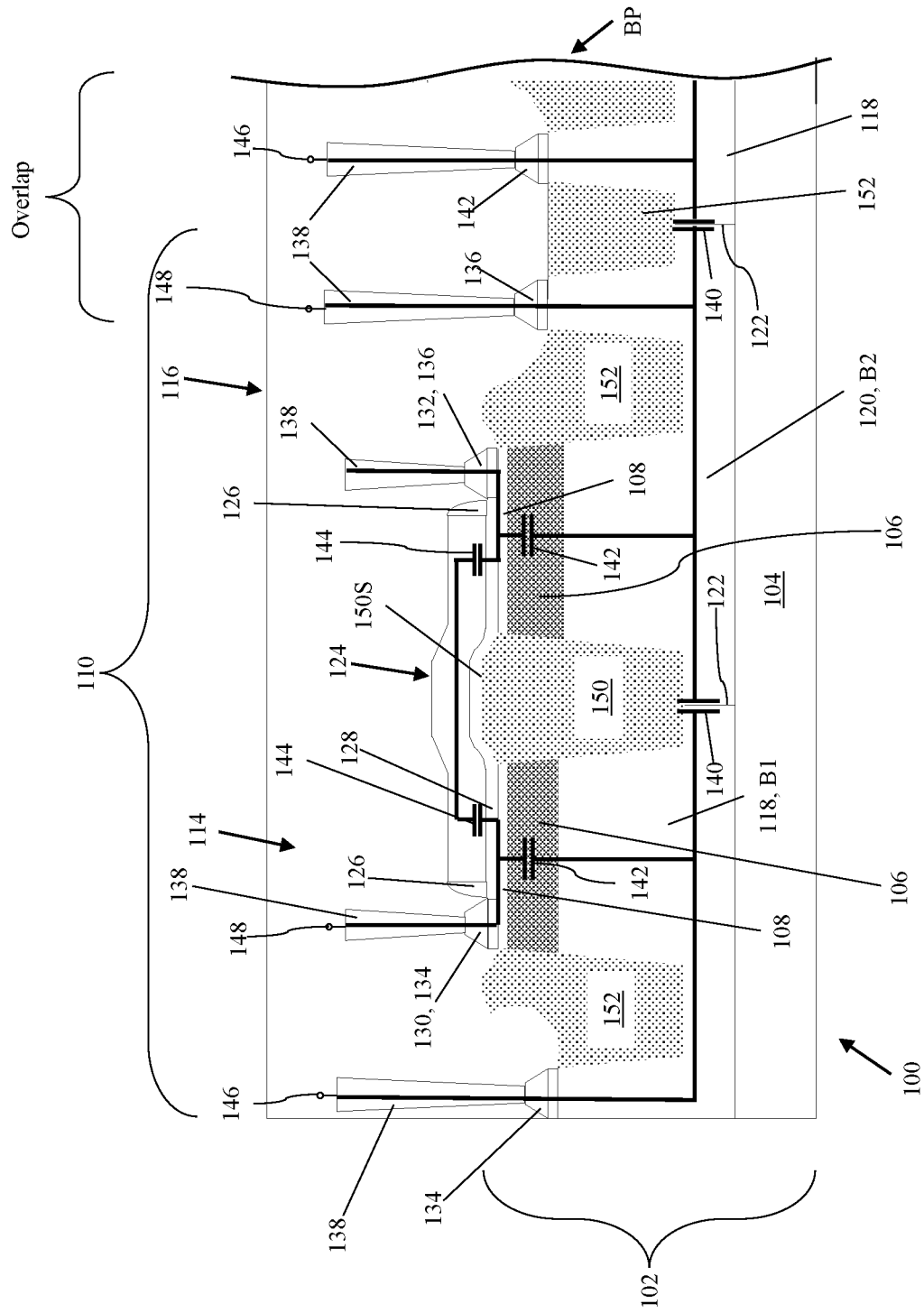
FIG. 3A shows an enlarged cross-sectional view of a portion of an integrated circuit structure with schematic capacitance indicators overlayed, according to embodiments of the disclosure.
Figure 3B:
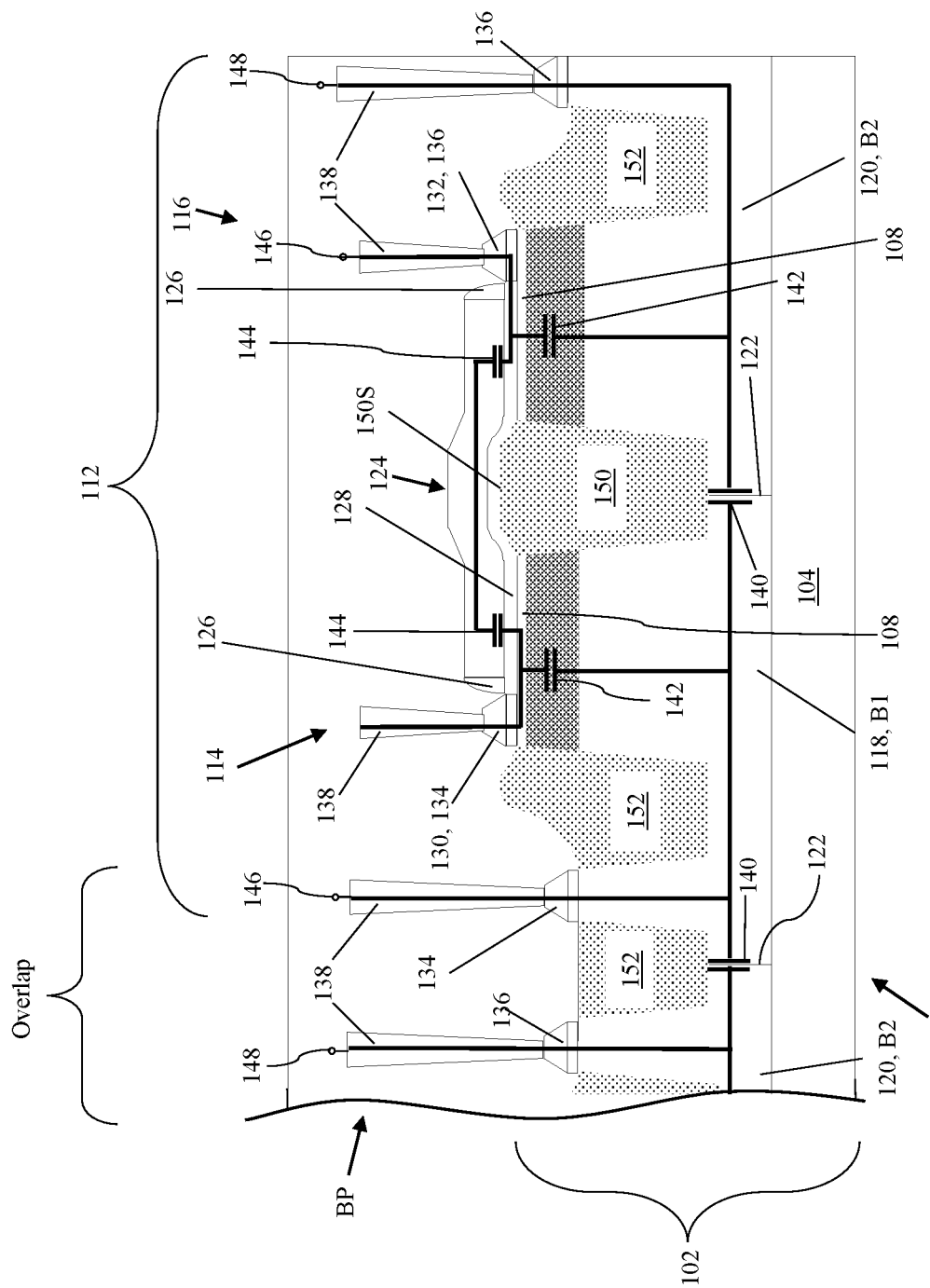
FIG. 3B shows an enlarged cross-sectional view of a portion of an integrated circuit structure with schematic capacitance indicators overlayed, according to embodiments of the disclosure.

FIGS. 3A and 3B show cross-sectional views of IC structure 100 according to implementations of the disclosure. FIG. 3A shows one half of structure 100 on one side of break point BP, and FIG. 3B shows another half of structure 100 on the other side of break point BP. An overlap region (labelled simply as "Overlap") is included to illustrate continuity between FIGS. 3A and 3B, i.e., structure 100 is horizontally continuous in FIGS. 3A and 3B.

Structure 100 may be identical to structure 100 in other implementations described herein, except that it may include a second device 112 adjacent device 110 (referred to as "first device 110" in this embodiment) and includes a distinct electrical configuration. Second device 112 may be structurally identical to first device 110, i.e., second device 112 may include n-MOS capacitor 114 adjacent p-MOS capacitor 116 where n-MOS capacitor 114 and p-MOS capacitor 116 are electrically connected in series to lower the capacitance of FET capacitors 144 but increase the Vmax thereof.

In some implementations, structure 100 may include trench isolation 150 under gate 124 and extending at least partially between interface 122 of n-well 118 and p-well 120. In other implementations, trench isolation 150 may include raised portion 150S under gate 124 and vertically between first SOI layer portion 154 and second SOI layer portion 156. In yet other implementations, structure 100 further includes an additional trench isolation 152 between first device 110 and second device 112. In such implementations, additional trench isolation 152 extends at least partially between interface 122 between p-well 120 of first device 110 and n-well 118 of second device 112.

Structure 100 in FIGS. 3A and 3B may include first voltage source 146 electrically connected to n-well 118 of first device 110 and to n-well 118 and p-type semiconductor 132 of second device 112. In such an embodiment, first voltage source 146 outputs a first voltage. Similarly, second voltage source 148 may be electrically connected to n-type semiconductor 130 and p-well 120 of first device 110, and to p-well 120 of second device 112. Second voltage source 148 outputs a second voltage, where the first voltage is greater than the second voltage. In another embodiment, also in FIGS. 3A and 3B, p-type semiconductor 132 of first device 110 and n-type semiconductor 130 second device 112 may each be not connected to an electrical signal (i.e., p-type semiconductor 132 of first device 110 and n-type semiconductor 130 of second device 112 may be floating).

By configuring first device 110 and second device 112 within structure 100 in the aforementioned electrical configuration, FET capacitors 144 of each of first device 110 and second device 112 may be electrically serially connected, thereby lowering total capacitance, and increasing Vmax, of first device 110 and second device 112. Hence, first device 110 and second device 112 function at a higher voltage in this configuration, thereby increasing device performance without increase in costs. FET capacitors 144 of each first device 110 and second device 112 may be electrically coupled in parallel with each junction capacitor 140 and BOX capacitor 142 of each of first device 110 and second device 112. Moreover, junction capacitors 140 are established between body terminals B1 and B2 of device 110, which can also be electrically connected in parallel with other capacitors. By connecting each junction capacitors 140 and BOX capacitors 142 in parallel with series-connected FET capacitors 144 of each of first device 110 and second device 112, structure 100 has a decreased total capacitance but n-MOS capacitor 114 and p-MOS capacitor 116 of each first device 110 and second device 112 have an advantageously increased Vmax.

By including gates 124 in the aforementioned electrical configuration, which may float at potential between a potential between n-type semiconductors 130 and p-type semiconductors 132, the Vmax before the FET capacitances 144 is increased relative to the conventional gate dielectric 128 Vmax. Additionally, electrically connecting n-well 118 to p-type semiconductor 132 creates a positive potential in n-well 118 relative to gate 124, thereby creating an n-type channel in SOI layer 108 thereunder and creating capacitance between n-type semiconductor 130 and gate 124 across the full area of gate dielectric 128. Similarly, electrically connecting p-well 120 to n-type semiconductor 130 creates a negative potential in p-well 120 relative to gate 124, thereby creating a p-type channel in SOI layer 108 thereunder and creating the capacitance between p-type semiconductor 132 and gate 124 across the full area of gate dielectric layer 128.

As mentioned previously, junction capacitors 140 are created at an interface 122 that exists between each n-well 118 and p-well 120 throughout structure 100, e.g., between n-well 118 and p-well 120 and SOI layer 108 above with an uppermost surface of trench isolation 150 therebetween. FET capacitors 144 are created between gate 124 and SOI layer 108 with gate dielectric layer 128 therebetween. In one embodiment, second voltage source 148 is connected to n-type semiconductor 130 and first voltage source 146 is connected to p-type semiconductor 132. In such a configuration, first voltage 146 is greater than second voltage 148. By biasing structure 100 this way, n-type semiconductor 130 and p-type semiconductor 132 and, thus, each FET capacitor 144 in first device 110 and second device 112 are connected in electrical series. Once connected in electrical series, FET capacitors 144 may further be connected in parallel with junction capacitors 140 and/or BOX capacitors 142 within structure 100 in a variety of ways to increase the total capacitance of structure 100.

FIGS. 4A, 4B, 5, and 6 show cross-sectional views of a method of forming structure 100 on SOI substrate 102 according to implementations of this disclosure. SOI substrate 102 may be similar to SOI substrate 102 in other implementations described herein. Buried insulator layer 106 may include any appropriate dielectric such as but not limited to silicon dioxide, i.e., forming BOX layer 106. Forming structure 100 may include forming n-MOS capacitor 114 adjacent p-MOS capacitor 116. As discussed herein, forming n-MOS capacitor 114 and p-MOS capacitor 116 includes forming subcomponents, e.g., n-well 118, p-well 120, gate 124, n-type semiconductor 130, p-type semiconductor 132, etc.

Figure 4B:
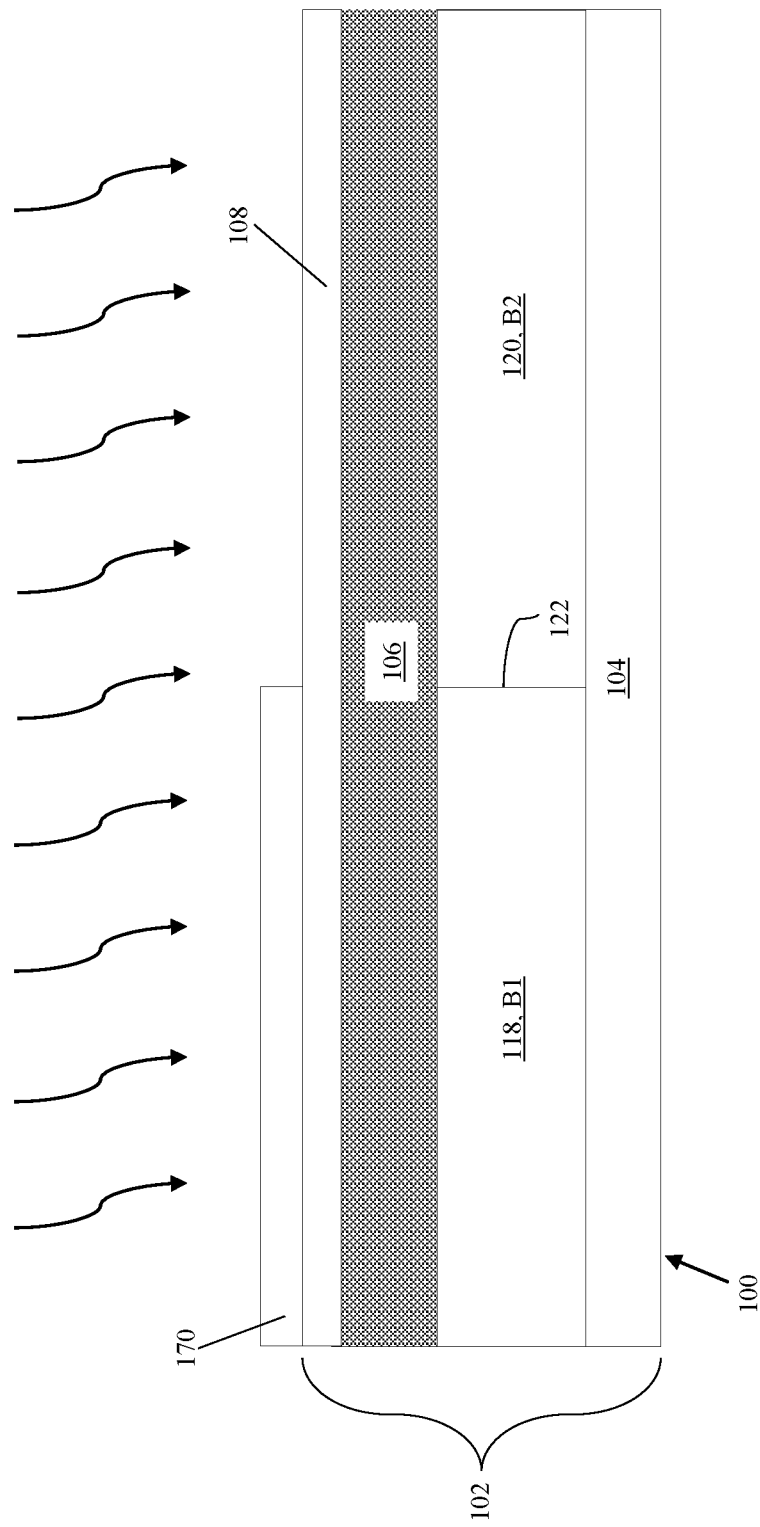
FIG. 4B shows an alternative cross-sectional view of forming a well at a step during fabrication, according to embodiments of the disclosure.

As shown in FIGS. 4A and 4B, forming structure 100 may include forming n-well 118 within base semiconductor layer 104 SOI substrate 102 and forming n-well under BOX layer 106 and forming p-well 120 adjacent n-well 118, thereby forming body terminals B1 and B2 incidentally. N-well 118 and p-well 120 are doped regions of structure 100 and may be formed, for example, by ion implantation through SOI layer 108 and BOX layer 106 using a mask 170, or by other doping methods, e.g., in-situ doping. As mentioned previously, doping is the process of introducing impurities (dopants) into the semiconductor substrate, or elements formed on the semiconductor substrate, and is often performed with a mask (or previously formed, elements in place) so that only certain areas of the substrate will be doped. An ion implanter is typically employed for the actual implantation. Therefore, doping n-well 118 and p-well 120 may include ion implanting impurities through BOX layer 106 and through SOI layer 108 into base semiconductor layer 104. The wavy lines represent any doping method. Hard mask 170 protects one side from doping as, for example, n-well 118 is formed.

The term "mask" may be given to a layer of material which is applied over an underlying layer of material, and patterned to have openings, so that the underlying layer can be processed where there are openings. After processing the underlying layer, the mask may be removed. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. Masks may be removed using any known removal process appropriate for the mask material, e.g., a wet etch for hard nitride mask or an ashing process (oxygen dry strip process) for a soft resist-based mask.

Although n-well 118 is illustrated as being formed first, p-well 120 may be formed first. Further, although well formation is depicted before patterning of BOX layer 106 or SOI layer 108, it may occur thereafter. Further, doping can occur before or after formation of trench isolation 150 and additional trench isolations 152.

Figure 5:
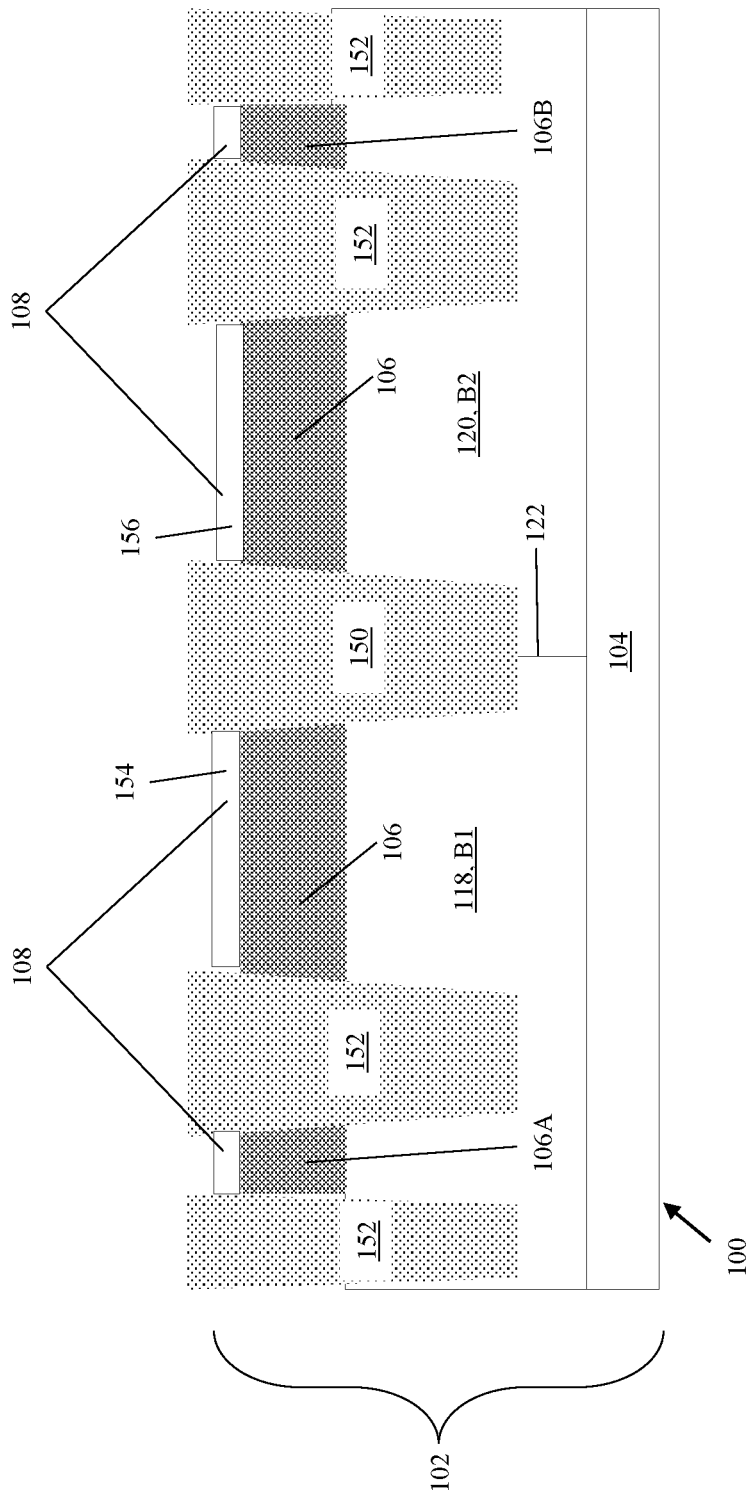
FIG. 5 shows a cross-sectional view of patterning an oxide layer and forming epitaxial materials at a step during fabrication, according to embodiments of the disclosure.
Figure 6:
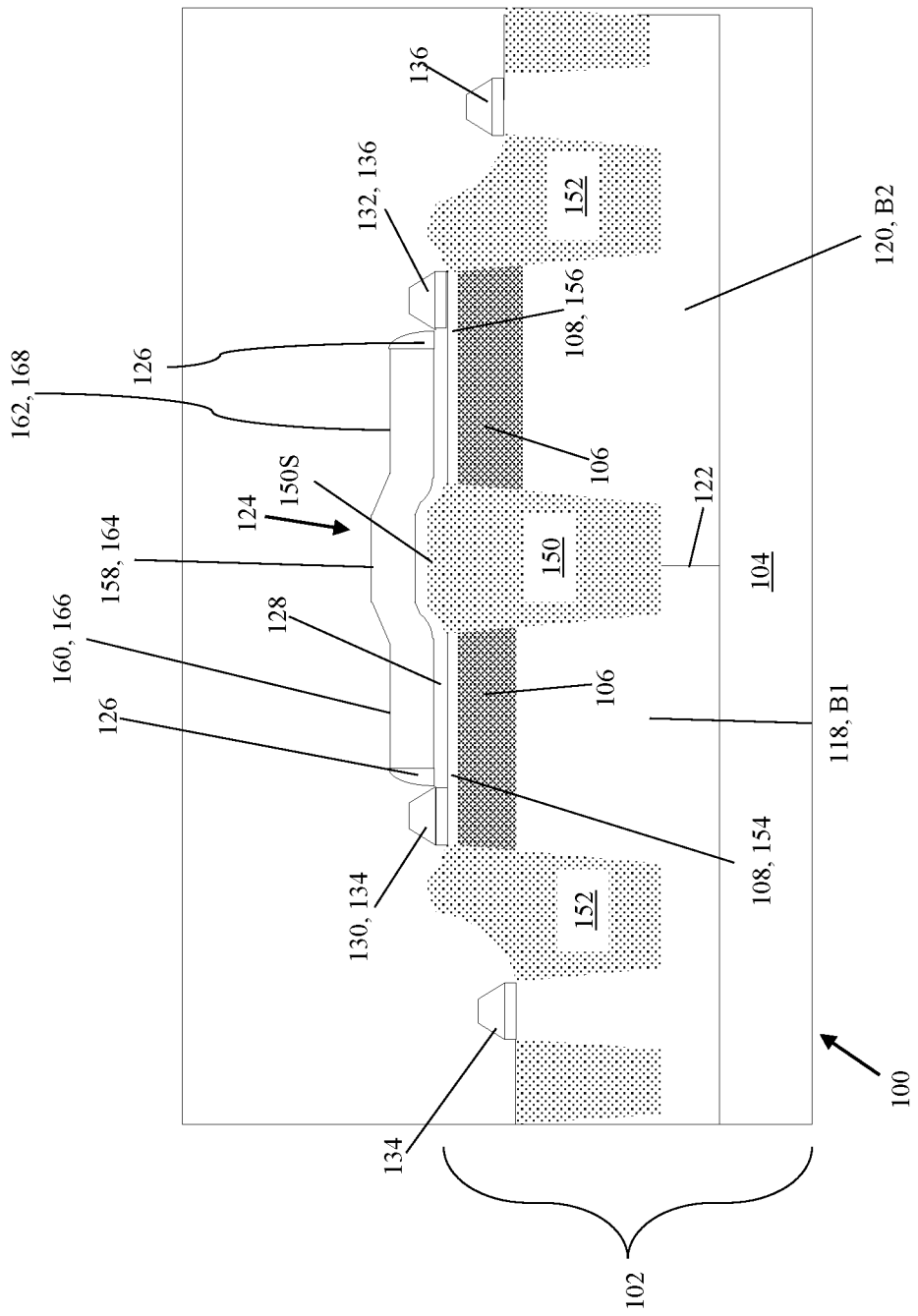
FIG. 6 shows a cross-sectional view of an integrated circuit structure after gate and epitaxial material formation, according to embodiments of the disclosure.

In some implementations, shown in FIGS. 5 and 6, forming SOI layer 108 may include forming first SOI layer portion 154 under n-type semiconductor 130 and forming second SOI layer portion 156 under p-type semiconductor 132. First SOI layer portion 154 and second SOI layer portion 156 are discontinuous in such implementations. This process can be carried out by selectively removing (e.g., by etching) portions of SOI layer 108. In some implementations, removed portions of SOI layer 108 are where trench isolation 150 and additional trench isolations 152 are subsequently formed. First SOI layer portion 154 and second SOI layer portion 156 may be formed by any CMOS process used to remove materials, such as by etching.

As mentioned previously, etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trench.

Referring now to FIG. 5, which shows after patterning BOX layer 106, SOI layer 108, and formation of trench isolation 150 and additional trench isolations 152. SOI layer 108 may be selectively etched to form first SOI layer portion 154 and second SOI layer portion 156, as shown in FIG. 5. Further, trench isolation 150 may be formed by etching trenches in bulk semiconductor substrate 104 and then filling the trenches with a dielectric or insulative material. Thereafter, trench isolation 150 and additional trench isolations 152 may be further etched or planarized.

FIG. 6 is a cross-sectional view of substrate 102 after subsequent removal of portions of BOX layer 106 and patterning SOI layer 108. In one embodiment, shown in FIG. 6, forming trench isolation 150 may include forming trench isolation 150 under gate 124 and extending between interface 122 of n-well 118 and p-well 120. In such an embodiment, trench isolation 150 may include raised portion 150S under gate 124 and vertically between first SOI layer portion 154 and second SOI layer portion 156. In another embodiment, also shown in FIG. 6, forming trench isolation 150 may include forming trench isolation 150 with raised portion 150S between first SOI layer portion 154 and second SOI layer portion 156.

N-type semiconductor 130 may be formed adjacent a first side of gate 124, and p-type semiconductor 132 may be formed adjacent a second side of gate 124. N-type semiconductor 130 and p-type semiconductor 132 may be any semiconducting material and formed by various methods, including deposition. Semiconductors are described above, and further discussion is omitted here for brevity.

In one embodiment, forming n-type semiconductor 130 may include forming n-type epitaxial material 134 and forming p-type semiconductor 132 may include forming p-type epitaxially formed material 136. N-type epitaxial material 134 and p-type epitaxial material 136 are discussed herein and a discussion here is omitted for brevity. Further removal of BOX layer 106A and 106B (FIG. 5) from over n-well 118 and p-well 120 may be necessary prior to forming n-type epitaxial material 134 over n-well 118 and forming p-type epitaxial material 136 over p-well 120.

Referring again to FIG. 1, completed structure 100 is formed after forming gate dielectric 128, gate 124 is over gate dielectric 128 over SOI layer 108, and gate spacers on either side of gate 124. Forming gate 124 may include forming gate dielectric layer 128 SOI layer 108 and over BOX layer 106. As mentioned previously, gate dielectric layer 128 may be formed including a high dielectric constant (high-K) material. Gate dielectric layer 128 may be, for example, deposited on BOX layer 106.

As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

In some implementations, forming gate 124 may include forming first gate portion 158 between second gate portion 160 and third gate portion 162 of gate 124. In such an embodiment, first gate portion 158 has uppermost surface 164 above uppermost surface 166 of the second gate portion 160 and uppermost surface 168 of third gate portion 162. The conformal shape of gate 124 is from forming gate 124 materials over trench isolation 150, which, as mentioned previously, may include a raised portion 150S. Forming gate 124 may include forming gate spacers 126 on either side of gate 124. Gate spacers 126 may be, e.g., a dielectric material which serves as a protective coat throughout fabrication and as electrical isolation during operation.

Referring still to FIG. 1, contacts 138 may be formed on n-type semiconductor 130 and p-type semiconductor 132 and n-well 118 and p-well 120. Contacts 138 may be formed by patterning a mask, etching opening(s) to the respective depth through a dielectric layer, and forming a conductor in the opening(s). Forming contacts may include forming conductive refractory metal liners and metals. The refractory metal liner (not labeled for clarity) may include, for example, ruthenium (Ru), tantalum (Ta), titanium (Ti), tungsten (W), iridium (Ir), rhodium (Rh) and platinum (Pt), etc., or mixtures of thereof. The metal of contacts may be any now known or later developed contact/wire metal such as but not limited to copper (Cu) or tungsten (W).

The method and structure as described above are used in the fabrication and operation of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC) structure, comprising:
a semiconductor-on-insulator (SOI) substrate, including a buried insulator layer over a base semiconductor layer, and a semiconductor-on-insulator (SOI) layer over the buried insulator layer; and
a gate over a gate dielectric layer over the SOI layer;
an n-type metal-oxide semiconductor (n-MOS) capacitor, including:
an n-well under the buried insulator layer, and
an n-type semiconductor adjacent a first side of the gate; and
a p-type metal-oxide semiconductor (p-MOS) capacitor adjacent the n-MOS capacitor and including:
a p-well adjacent the n-well, and
a p-type semiconductor adjacent a second side of the gate, and
wherein the gate is electrically connected only to the n-MOS capacitor and the p-MOS capacitor.

2. The IC structure of claim 1, wherein the gate is not connected to an electrical signal.

3. The IC structure of claim 1, wherein the gate has a first portion between a second portion and a third portion, wherein the first portion has an uppermost surface above an uppermost surface of the second portion and an uppermost surface of the third portion.

4. The IC structure of claim 1, wherein the SOI layer includes a first portion under the n-type semiconductor and a second portion under the p-type semiconductor, wherein the first portion of the SOI layer and the second portion of the SOI layer are discontinuous.

5. The IC structure of claim 1, further comprising a trench isolation under the gate, the trench isolation extending between an interface between the n-well and the p-well,
wherein the trench isolation includes a raised portion under the gate and vertically between a first portion the SOI layer and a second portion of the SOI layer.

6. The IC structure of claim 1, further comprising:
a first voltage source connected to the p-type semiconductor and the n-well, wherein the first voltage source outputs a first voltage; and
a second voltage source connected to the n-type semiconductor and the p-well, wherein the second voltage source outputs a second voltage, and
wherein the first voltage is greater than the second voltage.

7. The IC structure of claim 1, wherein the n-type semiconductor includes an n-type epitaxial material and the p-type semiconductor includes a p-type epitaxial material.

8. An integrated circuit (IC) structure, comprising:
a semiconductor-on-insulator (SOI) substrate including a base semiconductor layer, a buried insulator layer over the base semiconductor layer, and a semiconductor-on-insulator (SOI) layer over the buried insulator layer; and
a first device including:
a gate over a gate dielectric layer over the SOI layer;
an n-type metal-oxide semiconductor (n-MOS) capacitor, including:
an n-well under the buried insulator layer, and
an n-type semiconductor adjacent a first side of the gate; and
a p-type metal-oxide semiconductor (p-MOS) capacitor, including:
a p-well adjacent the n-well, and
a p-type semiconductor adjacent a second side of the gate, and
a second device adjacent the first device and including:
a gate over a gate dielectric layer over the SOI layer;
an n-MOS capacitor, including:
an n-well under the buried insulator layer, and
an n-type semiconductor adjacent a first side of the gate; and
a p-MOS capacitor, including:
a p-well adjacent the n-well, and
a p-type semiconductor adjacent a second side of the gate,
wherein the n-MOS capacitor and p-MOS capacitor of the first device and the n-MOS capacitor the p-MOS capacitor of the second device are each electrically serially connected.

9. The IC structure of claim 8, further comprising a trench isolation under the gate of the first device and extending at least partially between an interface of the n-well and the p-well.

10. The IC structure of claim 9, wherein the trench isolation includes a raised portion under the gate of the first device and vertically between a first portion of the SOI layer and a second portion of the SOI layer.

11. The IC structure of claim 9, further comprising an additional trench isolation between the first device and the second device, wherein the trench isolation extends at least partially between an interface between the p-well of the first device and the n-well of the second device.

12. The IC structure of claim 8, wherein the gate of the first device and the gate of the second device are each not connected to an electrical signal.

13. The IC structure of claim 8, further comprising:
a first voltage source connected to the n-well of the first device, and to the n-well and the p-type semiconductor of the second device, wherein the first voltage source outputs a first voltage; and
a second voltage source connected to the n-type semiconductor and the p-well of the first device, and to the p-well of the second device, wherein the second voltage source outputs a second voltage, and
wherein the first voltage is greater than the second voltage.

14. The IC structure of claim 13, wherein the p-type semiconductor of the first device and the n-type semiconductor of the second device are each not connected to an electrical signal.

15. The IC structure of claim 8, wherein the n-type semiconductor of the first device and the n-type semiconductor of the second device each include an n-type epitaxial material; and
wherein the p-type semiconductor of the first device and the p-type semiconductor of the second device each include a p-type epitaxial material.

16. A method of forming an integrated circuit (IC) structure on a semiconductor-on-insulator ("SOI") substrate, comprising:

forming a gate over a gate dielectric layer over an SOI layer of the SOI substrate,
forming an n-type metal-oxide semiconductor (n-MOS) capacitor, including:
forming an n-well under the buried insulator layer, and
forming an n-type semiconductor adjacent a first side of the gate; and
forming a p-type metal-oxide semiconductor (p-MOS) capacitor adjacent the n-MOS capacitor and including:
forming a p-well adjacent the n-well, and
forming a p-type semiconductor adjacent a second side of the gate, and electrically connecting the gate to only the n-MOS capacitor and to the p-MOS capacitor.

17. The method of claim 16, wherein the gate is not connected to an electrical signal.

18. The method of claim 16, wherein forming the gate further comprises forming a first portion between a second portion and a third portion, wherein the first portion has an uppermost surface above an uppermost surface of the second portion and an uppermost surface of the third portion.

19. The method of claim 16, wherein forming the SOI layer further comprises forming a first portion under the n-type semiconductor and a second portion under the p-type semiconductor, wherein the first portion of the SOI layer and the second portion of the SOI layer are discontinuous.

20. The method of claim 16, further comprising:
forming a trench isolation under the gate, the trench isolation extending between an interface between the n-well and the p-well,
wherein the trench isolation includes a raised portion under the gate and vertically between a first portion the SOI layer and a second portion of the SOI layer.

* * * * *